United States Patent
Gamarnik et al.

[11] Patent Number: 5,997,636
[45] Date of Patent: Dec. 7, 1999

[54] METHOD AND APPARATUS FOR GROWING CRYSTALS

[75] Inventors: Moisey Y. Gamarnik, Bensalem; Ulises R. Alvarado, King of Prussia, both of Pa.

[73] Assignee: Instrumentation Technology Associates, Inc., Exton, Pa.

[21] Appl. No.: 09/071,546

[22] Filed: May 1, 1998

[51] Int. Cl.[6] .................................. C30B 7/00; B01D 9/00
[52] U.S. Cl. ...................... 117/70; 422/245.1; 117/208; 117/901
[58] Field of Search ............................ 117/70, 206, 901; 422/245.1

[56] References Cited

U.S. PATENT DOCUMENTS

| | | | |
|---|---|---|---|
| 4,239,583 | 12/1980 | Hatch et al. | 117/16 |
| 4,295,857 | 10/1981 | Schuler et al. | 23/301 |
| 4,886,646 | 12/1989 | Carter et al. | 117/206 |
| 4,919,899 | 4/1990 | Herrmann et al. | 422/245.1 |
| 5,078,975 | 1/1992 | Rhodes et al. | 117/206 |
| 5,096,676 | 3/1992 | McPherson et al. | 117/202 |
| 5,104,478 | 4/1992 | Sikdar et al. | 117/70 |
| 5,106,592 | 4/1992 | Stapelmann et al. | 117/206 |
| 5,173,087 | 12/1992 | Kroes et al. | 23/295 R |
| 5,221,410 | 6/1993 | Kushner et al. | 117/70 |
| 5,363,797 | 11/1994 | Uenishi et al. | 117/68 |
| 5,419,278 | 5/1995 | Carter | 117/206 |
| 5,641,681 | 6/1997 | Carter | 436/4 |
| 5,643,540 | 7/1997 | Carter et al. | 422/245.1 |

OTHER PUBLICATIONS

Moreno, Abel et al., "Growth of shaped single crystals of proteins", Journal of Crystal Growth, vol. 166:919–924, Sep. 1996.

*Primary Examiner*—Felisa Hiteshew
*Assistant Examiner*—Donald L. Champagne
*Attorney, Agent, or Firm*—Howson & Howson

[57] ABSTRACT

For growing crystals, either in ground testing or in space, a capillary tube is used, which contains the solution of the substance to be crystallized, a layer of absorbent and a layer of air or other gas separating the solution from the absorbent. Two absorbent layers may be used on opposite sides of the solution, each separated from the solution by a gaseous layer. To delay the onset of crystallization, the absorbent on each side may be separated from the solution by two gaseous layers, with a charge of absorbable liquid between them. An absorbent may be removed or modified by removing or perforating an end cap used to seal the absorbent within the capillary tube.

17 Claims, 1 Drawing Sheet

METHOD AND APPARATUS FOR GROWING CRYSTALS

FIELD OF THE INVENTION

This invention relates in general to a method and apparatus for growing crystals, and in particular to a method and device for growing protein crystals in experiments conducted on earth and in the microgravity environment of space.

BACKGROUND OF THE INVENTION

Processes of growing crystals are described in the following U.S. Pat. Nos.:

| | | |
|---|---|---|
| 4,239,583 | Dec., 1980 | Hatch et al |
| 4,295,857 | Oct., 1981 | Schuler et al |
| 4,919,899 | April, 1990 | Herrmann et al |
| 4,886,646 | Dec., 1989 | Carter et al |
| 5,078,975 | Jan., 1992 | Rhodes et al |
| 5,096,676 | April, 1992 | McPherson et al |
| 5,106,592 | April, 1992 | Stapelmann et al |
| 5,173,087 | Dec., 1992 | Kroes et al |
| 5,221,410 | June, 1993 | Kushner |
| 5,363,797 | Nov., 1994 | Uenishi et al |
| 5,419,278 | May, 1995 | Carter |
| 5,641,681 | June, 1997 | Carter |
| 5,643,540 | July, 1997 | Carter et al |

The principal object of this invention is to provide a simple and reliable method for growing crystals of proteins or other organic or inorganic materials in a compact apparatus. In accordance with the invention crystals are grown within a sealed capillary tube in which a solution of the substance to be crystallized is separated from a suitable absorbent by a quantity of gas, and in which the spacing between the solution and the absorbent is maintained by capillary forces. The solvent evaporates gradually, and the solvent vapor passes through the gas and is absorbed by the absorbent.

The preferred apparatus in accordance with the invention uses a single capillary tube which contains the solution of the substance to be crystallized, one or more charges of liquid containing absorbent and one or more volumes of air or other gas separating the solution from the absorbent liquids. End caps placed at opposing ends of the capillary tube seal the fluids within the tube.

The invention provides a very simple and compact device for growing crystals of protein and other materials of scientific interest. The invention affords the experimenter with a high degree of flexibility in setting the proper rate of evaporation of the solvent and other variables affecting crystallization.

Other objects and advantages of the invention will be apparent from the following description, when read in conjunction with the drawings.

DETAILED DESCRIPTION

Figure 1:
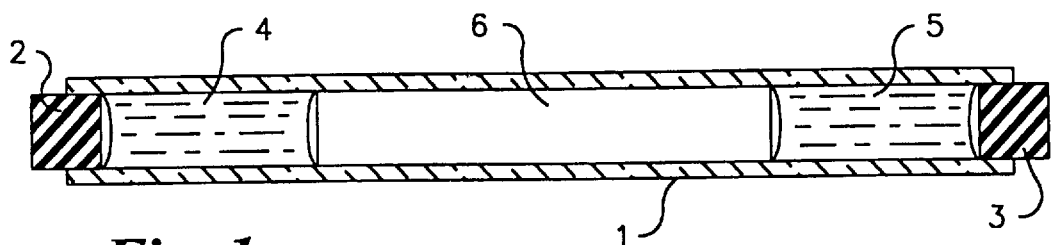
FIG. 1 is a schematic longitudinal section of a crystal-growing device in accordance with a first embodiment of the invention.

A typical installation for experimentation aboard a spacecraft will include a plurality of the crystallizing units of FIG. 1 housed in one or several sealed containers meeting the safety and containment requirements of the particular space carrier system. Each crystallizing unit contains materials for growing a crystal, or a plurality of crystals, of a particular substance.

In the simplest embodiment of this invention, as depicted in FIG. 1, the crystallizing unit comprises a capillary tube 1 containing a column made up of three layers. The first layer is a solution 4 of the substance to be crystallized. The second layer is an absorbent 5, which is typically a liquid. In the preparation of the crystallizing unit, the solution 4 and the absorbent 5 are injected into the opposite ends of the capillary tube 1. The solution and absorbent are separated by a gaseous layer 6, which can be air or another gas through which vapor of the solvent from the solution can be transported to the absorbent layer.

The ends of the capillary tube are sealed by end caps 2 and 3. The internal cross-sectional area of the capillary tube is selected so that the capillary forces acting on the liquids held within the sealed tube are sufficient to prevent direct contact between the liquids even under the inertial and vibratory forces encountered during handling and transportation, including rocket launch and ascent in the case of experiments performed in space. The internal diameter of the capillary tube is typically less than 3 millimeters.

Nucleation and growth of a crystal normally occur within the crystallizing solution after the increasing concentration of the material to be crystallized has reached supersaturation. This increase in concentration occurs as a result of the absorption of the solvent by the absorbent. During the vapor transport process in which evaporated solvent passes from the crystallizing solution 4 to the absorbent 5, the length of the gaseous layer remains approximately constant but shifts position toward the crystallizing solution 4 by a distance corresponding to the volume of the solvent that is absorbed. Consequently, at any time in the crystal growth process, it is possible to calculate the concentration of the crystallizing solution 4 as a function of the ratio of its length divided by its original length.

The preferred embodiment of the invention utilizes a glass capillary tube and silicone rubber end caps. Typical absorbents, used in connection with aqueous media and crystallizing proteins such as lysozyme, are glycerine, polyethylene glycol, and solutions of sodium chloride. In accordance with established crystal growth procedure, buffers such as sodium acetate at controlled pH levels, as well as various concentrations of salts such as sodium chloride, corresponding to different pH levels, can be added to the solution containing the substance to be crystallized in order to promote optimum crystallization conditions.

During loading of the liquid solutions into the capillary tube 1, and during the process of crystal growth, the temperatures of the crystallizing solution 4 and of the absorbent 5 are maintained within a desired range to control the initial saturation of the crystallizing solution and the subsequent rate at which supersaturation and crystallization take place.

The method of crystallization in accordance with this invention provides a high degree of control of nucleation and crystal growth by allowing the experimenter to set the desired rate profile of evaporation and absorption by proper choice of the following variables: the concentration and volume of the crystallizing solution 4, the concentration and volume of the absorbent 5, the length of the gaseous layer between the crystallizing solution and the absorbent, and the temperatures of the crystallizing solution and absorbent. For instance, in many processes involving the crystallization of proteins such as lysozyme it is desirable to set a relatively rapid rate of evaporation during the initial phase of the growth process leading to nucleation, followed by a lower rate of evaporation during the crystal growth process. To accomplish this desired rate profile of evaporation and absorption, the experimenter can utilize a gaseous layer 6 having a small volume (e.g. 20 microliters), and a small volume of absorbent 5 (e.g. 10 microliters). The short gaseous layer establishes a relatively low drop in the vapor pressure in the gaseous layer, while the small volume of absorbent allows a relatively rapid decrease in the rate of evaporation after the initial phase of evaporation, due to the dilution of the absorbent by the absorbed solvent.

Figure 2:
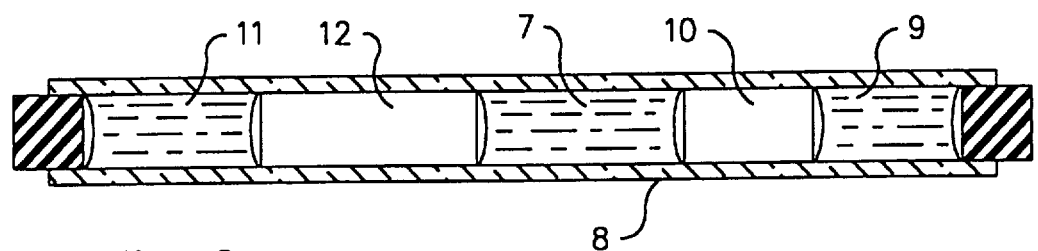
FIG. 2 is a schematic longitudinal section of a first alternative embodiment.

The alternative embodiment of the invention, depicted in FIG. 2, is used in applications requiring a rapid initial rate of evaporation and a slower, relatively constant, subsequent rate of evaporation. In this embodiment, the crystallizing solution layer 7 is located at an intermediate position along the length of a capillary tube 8, and is separated from a first absorbent layer 9 by a first gaseous layer 10. A secondary absorbent layer 11 is provided on the opposite side of the crystallizing solution layer and layers 7 and 11 are separated from each other by a secondary gaseous layer 12. Thus, in this arrangement, there are two separate absorbents for the evaporating solvent. When the first or primary absorbent 9 becomes diluted with the solvent, the second absorbent layer 11 (which will ordinarily be a different absorbent with much reduced capacity) takes over absorption for the remainder of the crystal growth process. The performance of the device is also affected by the lengths of the gaseous layers 10 and 12, which may also differ from each other. For instance, FIG. 2 shows a gaseous layer 12 that is longer than gaseous layer 10. In a typical application, a rapid initial rate of evaporation and absorption are attained through a concentrated absorbent 9 and a short primary gaseous layer 10, and a slow subsequent rate is attained through a relatively weak secondary absorbent 11 and a long secondary gaseous layer 12.

Figure 3:
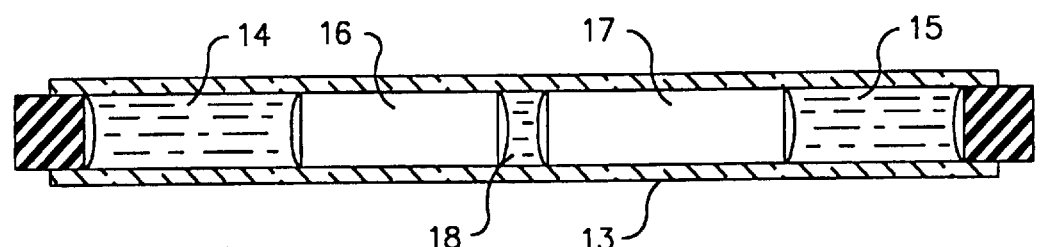
FIG. 3 is a schematic longitudinal section of a second alternative embodiment.

The second alternative embodiment of the invention, illustrated in FIG. 3, is used in applications requiring a delay in the initiation of the evaporation and absorption process. The device comprises a capillary tube 13 having a layer of crystallizing solution 14 at one end and an absorbent layer 15 at the opposite end, as in the embodiment of FIG. 1. Between the crystallizing layer and the absorbent layer are two gaseous layers 16 and 17, separated from each other by a small liquid barrier layer 18, consisting of water or another solvent that is able to be absorbed by the absorbent 15. The liquid barrier layer, which is typically one to five millimeters in length, prevents absorption of the vapor emitted by the crystallizing solution 14 until the barrier layer 18 is eliminated by absorption into the absorbent 15. This embodiment is particularly useful in experiments conducted in space, where the interval between the loading of fluids into the device and crystallization needs to be delayed, typically by one or two days, until the spacecraft carrying the device has attained microgravity conditions.

Figure 4:
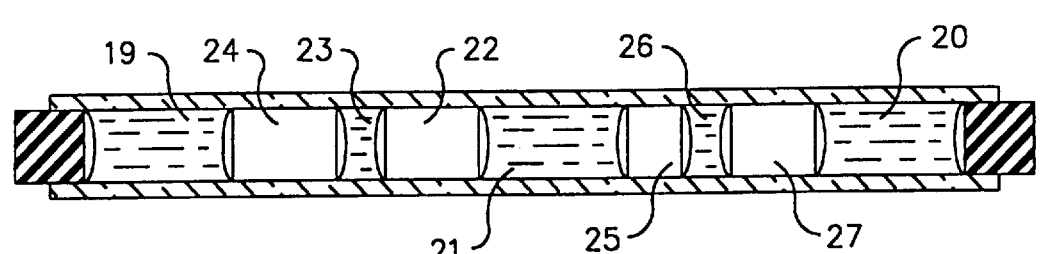
FIG. 4 is a schematic longitudinal section of a third alternative embodiment.

A third alternate embodiment of the invention, illustrated in FIG. 4, utilizes two absorbent layers 19 and 20 on opposite sides of a crystallizing solution layer 21, as in FIG. 2, each absorbent layer being separated from the crystallizing solution layer by two gaseous layers separated from each other by a liquid barrier layer. Thus, absorbent layer 19 is separated from crystallizing layer 21 by gaseous layer 22, barrier layer 23 and gaseous layer 24. Likewise, absorbent layer 20 is separated from crystallizing layer 21 by gaseous layer 25, barrier layer 26 and gaseous layer 27.

In still another alternative embodiment, utilizing the device of FIG. 1, the absorbent can be modified at an intermediate stage in the crystallization process by removing, diluting or replacing some or all of the absorbent. This is accomplished by removing or perforating the end cap 3 after a portion of the crystal growth process has taken place. A measured volume or all of the absorbent 5 can be removed and, if desired, replaced by a measured volume of fresh absorbent or a different type of absorbent. Alternatively the absorbent may be diluted by the addition of a suitable amount of another liquid. This alternative method is particularly useful in crystal growth applications where the crystal growth process is observed microscopically and, at a specific phase in the observed crystal growth process, modification of the absorbent is deemed necessary to set the required rate of evaporation and absorption in order to optimize the rate of evaporation and absorption for the remainder of the crystal growth cycle.

EXAMPLES

In an example of a crystal growth experiment carried out in a laboratory, a glass capillary configured as in FIG. 1 was used. The capillary had an internal diameter of 1.6 mm and an outer diameter of 2.1 mm. Silicone rubber stoppers were used as end caps 2 and 3. A protein solution was prepared, consisting of 8% lysozyme in 0.1 molar sodium acetate plus 1% sodium chloride in double distilled water. Glycerine was used as an absorbent. The liquids were maintained at room temperature, nominally 20° C.

In a first test, 26 microliters of protein solution were loaded into the capillary tube, producing a layer 13 mm in length. 12 microliters of glycerine were introduced into the opposite end of the tube producing an absorbent layer 6 mm in length. The two layers were separated by an air gap 10 mm in length, consisting of 20 microliters of air. The capillary tube was observed for eight days. On the eighth day by measuring the ratio of the length of the protein solution to its original length the amount of evaporation was determined to be 40%. A transparent crystal measuring 1.5 mm in length and 1.2 mm in width was observed.

In a second test, 12 microliters of the same protein solution were introduced into one end of a similar capillary tube, and 2.4 microliters of the absorbent were introduced into the opposite end of the tube. The lengths of the protein layer, the air gap and the absorbent layer were respectively 6 mm, 12 mm and 1.2 mm. Crystal growth was observed over a seven day interval. On the eighth day, the amount of evaporation was determined to be 67%, and five crystals were observed ranging in length from 0.7 to 1.4 mm.

Figure 5:
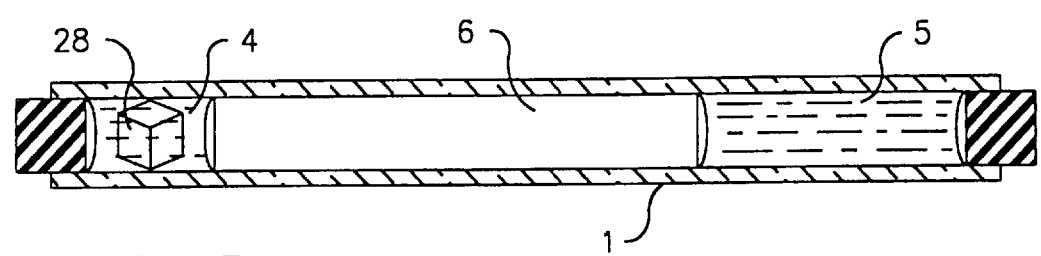
FIG. 5 is a schematic longitudinal section of a crystal growing device in accordance with the first embodiment, showing a crystal grown therein.

In a third test, 20 microliters of the same protein solution were introduced into one end of a similar capillary tube, and 2.6 microliters of the absorbent were introduced into the opposite end of the tube. The lengths of the protein layer, the air gap and the absorbent layer were respectively 10 mm, 9 mm and 1.3 mm. Crystal growth was observed over a nineteen day interval. On the twentieth day, the amount of evaporation was determined to be 70%, and one perfectly shaped, transparent crystal was observed, measuring 2 mm in length and 1.5 mm in width. The crystal 28 is illustrated in FIG. 5.

The results of these and other similar tests have demonstrated that the invention affords the experimenter with a high degree of flexibility in the selection of crystal growth parameters to accommodate various crystal growth requirements.

Various modifications can be made to the apparatus and method of the invention. For example, the capillary tubes can be incorporated in large numbers into containers having controls for maintaining the desired temperature, and because the capillary tubes are transparent, photoelectric detectors can be used to monitor the rate of evaporation by recording the movement of the interfaces between the crystallizing solutions and the gaseous layers. Other modifications, which will occur to persons skilled in the art, can be made without departing from the scope of the invention as defined in the following claims.

We claim:

1. A method for growing crystals comprising the steps of:
   establishing a column of layers within a capillary tube, the column comprising a solution of a substance to be crystallized and a solvent, an absorbent, and a gaseous layer separating the solution and the absorbent from each other; and
   increasing the concentration of said substance in the solution by gradually evaporating the solvent and absorbing at least a part of the evaporated solvent in the absorbent, thereby causing crystallization of said substance to take place.

2. The method of claim 1 in which the solution of the substance to be crystallized is located at an intermediate position along the length of the capillary tube, in which the gaseous layer is located on one side of the solution, in which the column of layers includes a second absorbent and a second gaseous layer separating the solution and the second absorbent from each other, and in which, in the evaporating step, another part of the evaporated solvent is absorbed in the second absorbent.

3. The method of claim 1 in which the absorbent has a first rate of absorption, in which the solution of the substance to be crystallized is located at an intermediate position along the length of the capillary tube, in which the gaseous layer is located on one side of the solution, in which the column of layers includes a second absorbent having a rate of absorption different from said first rate, and a second gaseous layer separating the solution and the second absorbent from each other, and in which, in the evaporating step, another part of the evaporated solvent is absorbed in the second absorbent.

4. The method of claim 1 in which the absorbent has a first rate of absorption, in which the solution of the substance to be crystallized is located at an intermediate position along the length of the capillary tube, in which the gaseous layer is located on one side of the solution, in which the column of layers includes a second absorbent having a rate of absorption less than said first rate, and a second gaseous layer separating the solution and the second absorbent from each other, in which, in the evaporating step, another part of the evaporated solvent is absorbed in the second absorbent, and in which the amount of the absorbent having the first rate is limited to an amount such that absorption of solvent takes place initially at a rapid rate primarily into the absorbent having the first rate of absorption, and thereafter takes place at a slower rate primarily into the second absorbent.

5. The method of claim 1 in which the solution of the substance to be crystallized is located at an intermediate position along the length of the capillary tube, in which the absorbent is a first absorbent and the gaseous layer is a first gaseous layer located on one side of the solution, in which the column of layers includes a second absorbent and a second gaseous layer separating the solution and the second absorbent from each other, in which the length of the first gaseous layer is less than the length of the second gaseous layer, in which, in the evaporating step, another part of the evaporated solvent is absorbed in the second absorbent, and in which the amount of the first absorbent is such that absorption of solvent takes place initially at a rapid rate primarily into the first absorbent and thereafter takes place at a slower rate primarily into the second absorbent.

6. The method of claim 1 in which the solution of the substance to be crystallized is located at an intermediate position along the length of the capillary tube, in which the absorbent is a first absorbent and the gaseous layer is a first gaseous layer located on one side of the solution, in which the column of layers includes a second absorbent and a second gaseous layer separating the solution and the second absorbent from each other, in which the length of the first gaseous layer is less than the length of the second gaseous layer, in which the rate of absorption of the first absorbent is greater than the rate of absorption of the second absorbent, in which, in the evaporating step, another part of the evaporated solvent is absorbed in the second absorbent, and in which the amount of the first absorbent is such that absorption of solvent takes place initially at a rapid rate primarily into the first absorbent and thereafter takes place at a slower rate primarily into the second absorbent.

7. The method of claim 1 in which, in the step of establishing a column of layers within the capillary tube, the solution and absorbent are separated by the gaseous layer, a layer of liquid capable of being absorbed by the absorbent, and another gaseous layer, the layer of liquid being located between the gaseous layers, and in which the layer of liquid is first absorbed in the absorbent and thereafter at least part of the evaporated solvent is absorbed in the absorbent, whereby the crystallization of the substance to be crystallized is delayed.

8. The method of claim 1 in which said absorbent is a first absorbent, said gaseous layer is a first gaseous layer located on one side of the solution and in contact with the solution, in which, on said one side of the solution, the column of layers includes a second gaseous layer in contact with the first absorbent and a first layer of liquid, capable of being absorbed by the first absorbent, located between the first and second gaseous layers, and in which the column of layers comprises a second absorbent, a third gaseous layer in contact with the solution on the side thereof opposite to said one side, a fourth gaseous layer in contact with the second absorbent, and a second layer of liquid, capable of being absorbed by the second absorbent, located between the third and fourth gaseous layers, in which the first layer of liquid is absorbed in the first absorbent before at least a part of the solution is absorbed in the first absorbent, in which a part of the solution is absorbed in the second absorbent, and in which the second layer of liquid is absorbed in the second absorbent before a part of the solution is absorbed in the second absorbent, whereby the crystallization of the substance to be crystallized is delayed.

9. The method of claim 1 in which, after absorbing a part of the evaporated solvent in the absorbent, at least a part of the absorbent is removed from the capillary tube.

10. The method of claim 1 in which, after absorbing a part of the evaporated solvent in the absorbent, at least a part of the absorbent is removed from the capillary tube and replaced by a different absorbent.

11. The method of claim 1 in which, after absorbing a part of the evaporated solvent in the absorbent, at least a part of the absorbent is diluted.

12. The method of claim 1 in which, in the step of establishing a column of layers within a capillary tube, the capillary tube is sealed at opposing ends.

13. Apparatus for growing crystals comprising a capillary tube, a column of layers within the capillary tube, the column comprising a solution of a substance to be crystallized in a solvent, an absorbent, and a gaseous layer separating the solution and the absorbent from each other, in which the absorbent is a first absorbent and the gaseous layer is a first gaseous layer, in which the first gaseous layer is in contact with the solution on one side thereof, and having a second absorbent on the opposite side of the solution and a second gaseous layer in contact with the solution and located between the solution and the second absorbent.

14. The apparatus of claim 13, in which the second absorbent has a rate of absorption different from the rate of absorption of the first absorbent layer.

15. The apparatus of claim 13, in which the length of the first gaseous layer is less than the length of the second gaseous layer.

16. Apparatus for growing crystals comprising a capillary tube, a column of layers within the capillary tube, the column comprising a solution of a substance to be crystallized in a solvent, an absorbent, and a gaseous layer separating the solution and the absorbent from each other, in which the gaseous layer is a first gaseous layer in contact with the solution, and including a second gaseous layer in contact with the absorbent and a layer of liquid capable of being absorbed by the absorbent, the layer of liquid being located between the first and second gaseous layers.

17. The apparatus of claim 16, in which the column of layers comprises a second absorbent on the side of the solution opposite to said one side, a third gaseous layer in contact with the solution on the side thereof opposite to said one side, a fourth gaseous layer in contact with the second absorbent, and a second layer of liquid, capable of being absorbed by the absorbent, located between the third and fourth gaseous layers.

* * * * *